US012718856B2

(12) United States Patent
Do

(10) Patent No.: US 12,718,856 B2
(45) Date of Patent: Aug. 25, 2026

(54) SEMICONDUCTOR DEVICE AND OPERATING METHOD OF THE SEMICONDUCTOR DEVICE

(71) Applicant: SK hynix Inc., Icheon-si (KR)

(72) Inventor: Gap Sok Do, Icheon-si (KR)

(73) Assignee: SK hynix Inc., Icheon-si (KR)

(*) Notice: Subject to any disclaimer, the term of this patent is extended or adjusted under 35 U.S.C. 154(b) by 61 days.

(21) Appl. No.: 18/763,876

(22) Filed: Jul. 3, 2024

(65) Prior Publication Data

US 2025/0252987 A1 Aug. 7, 2025

(30) Foreign Application Priority Data

Feb. 2, 2024 (KR) ........................ 10-2024-0016528

(51) Int. Cl.
*G11C 8/12* (2006.01)
*G11C 7/10* (2006.01)
*G11C 8/08* (2006.01)

(52) U.S. Cl.
CPC .............. *G11C 8/12* (2013.01); *G11C 7/1069* (2013.01); *G11C 8/08* (2013.01)

(58) Field of Classification Search
CPC ........... G11C 8/12; G11C 7/1069; G11C 8/08; G11C 13/0004; G11C 2013/0054; G11C 2013/0057; G11C 7/065; G11C 13/004
IPC .................... G11C 8/12,7/1069, 8/08, 13/0004, 2013/0054, 2013/0057, 7/065, 13/004
See application file for complete search history.

(56) References Cited

U.S. PATENT DOCUMENTS 11,282,571 B2 3/2022 Mirichigni et al.
2021/0020226 A1* 1/2021 Lim ..................... G11C 13/003
2021/0027835 A1* 1/2021 Lee .................... G11C 13/0026

FOREIGN PATENT DOCUMENTS

KR 10-2020-0130008 A 11/2020

* cited by examiner

*Primary Examiner* — Mohammed A Bashar

(57) ABSTRACT

A semiconductor device may include a memory cell that is connected between a bit line and a word line, and a cell threshold voltage sensing circuit configured to provide a first voltage to the memory cell whenever a pulse is activated. The cell threshold voltage sensing circuit may generate a voltage corresponding to a current that flows through the memory cell whenever the pulse is activated, and may generate a threshold voltage sensing result signal by comparing the generated voltage with a reference voltage. The threshold voltage sensing result signal may be used to adjust the first voltage to a level corresponding to a threshold voltage of the memory cell, and the memory cell may be read using the adjusted first voltage to generate random data.

16 Claims, 8 Drawing Sheets

FIG. 4

Pulse

BL

WL

Sensing

Sensing

Sensing

1. GRAPH
Detect
Pass
or
Fail
2. GRAPH
3. GRAPH
4. GRAPH
Normal Quantile (σ)
Vth (V)
1
2
3
4

SEMICONDUCTOR DEVICE AND OPERATING METHOD OF THE SEMICONDUCTOR DEVICE

CROSS-REFERENCE TO RELATED APPLICATION

This application claims priority under 35 U.S.C. § 119 to Korean Patent Application No. 10-2024-0016528 filed on Feb. 2, 2024, which is incorporated herein by reference in its entirety.

BACKGROUND

1. Technical Field

Embodiments relate to a semiconductor integrated circuit and, particularly, to a semiconductor device and an operating method of the semiconductor device.

2. Related Art

Recently, as an electronic device is reduced in size, has low power consumption and high performance, and is diversified, a semiconductor device capable of storing information is required for various electronic devices, such as computers and portable communication devices. Accordingly, a semiconductor device capable of storing data by using a characteristic in which the semiconductor device switches between different resistance states depending on a voltage or current applied thereto is researched. Such a semiconductor device may include a resistive random access memory (RRAM), phase change random access memory (PRAM), ferroelectric random access memory (FRAM), magnetic random access memory (MRAM), or an E-fuse.

In particular, a semiconductor device using a switching characteristic in which the state of the semiconductor device is changed into different states depending on the direction of a current applied thereto is actively researched.

SUMMARY

In an embodiment, a semiconductor device may include a memory cell that is connected between a bit line and a word line, and a cell threshold voltage sensing circuit configured to provide a random-read voltage to the memory cell whenever a pulse is activated. The cell threshold voltage sensing circuit may generate a voltage corresponding to a current that flows through the memory cell whenever the pulse is activated, and may generate a threshold voltage sensing result signal by comparing the generated voltage with a reference voltage.

In an embodiment, an operating method of a semiconductor device may include providing a first voltage to one of a bit line and a word line whenever a pulse is activated in a random-read voltage tuning interval, providing a second voltage having a lower voltage level than the first voltage to one of the bit line and the word line, generating a current having an amount that is identical with the amount of current that flows through a memory cell that is connected between the bit line and the word line, generating a voltage corresponding to the identical amount of current and comparing the voltage level of the voltage with the voltage level of a reference voltage, and adjusting the voltage level of the first voltage based on a result of the comparison.

BRIEF DESCRIPTION OF THE DRAWINGS

FIGS. 4 to 6 illustrate an operation of the semiconductor device according to an embodiment of the present disclosure.

DETAILED DESCRIPTION

Hereinafter, embodiments according to the present disclosure are described with reference to the accompanying drawings.

Embodiments of the present disclosure may provide a semiconductor device capable of sensing the threshold voltage of a memory cell and an operating method of the semiconductor device. Furthermore, embodiments of the present disclosure may provide a semiconductor device capable of generating a random number by using a memory cell the threshold voltage of which has been sensed and an operating method of the semiconductor device.

The semiconductor device and the operating method of the semiconductor device according to embodiments of the present disclosure may enable an operation of a semiconductor device using a random number, by sensing the threshold voltage of a memory cell and generating a random number by using that memory cell.

Figure 1:
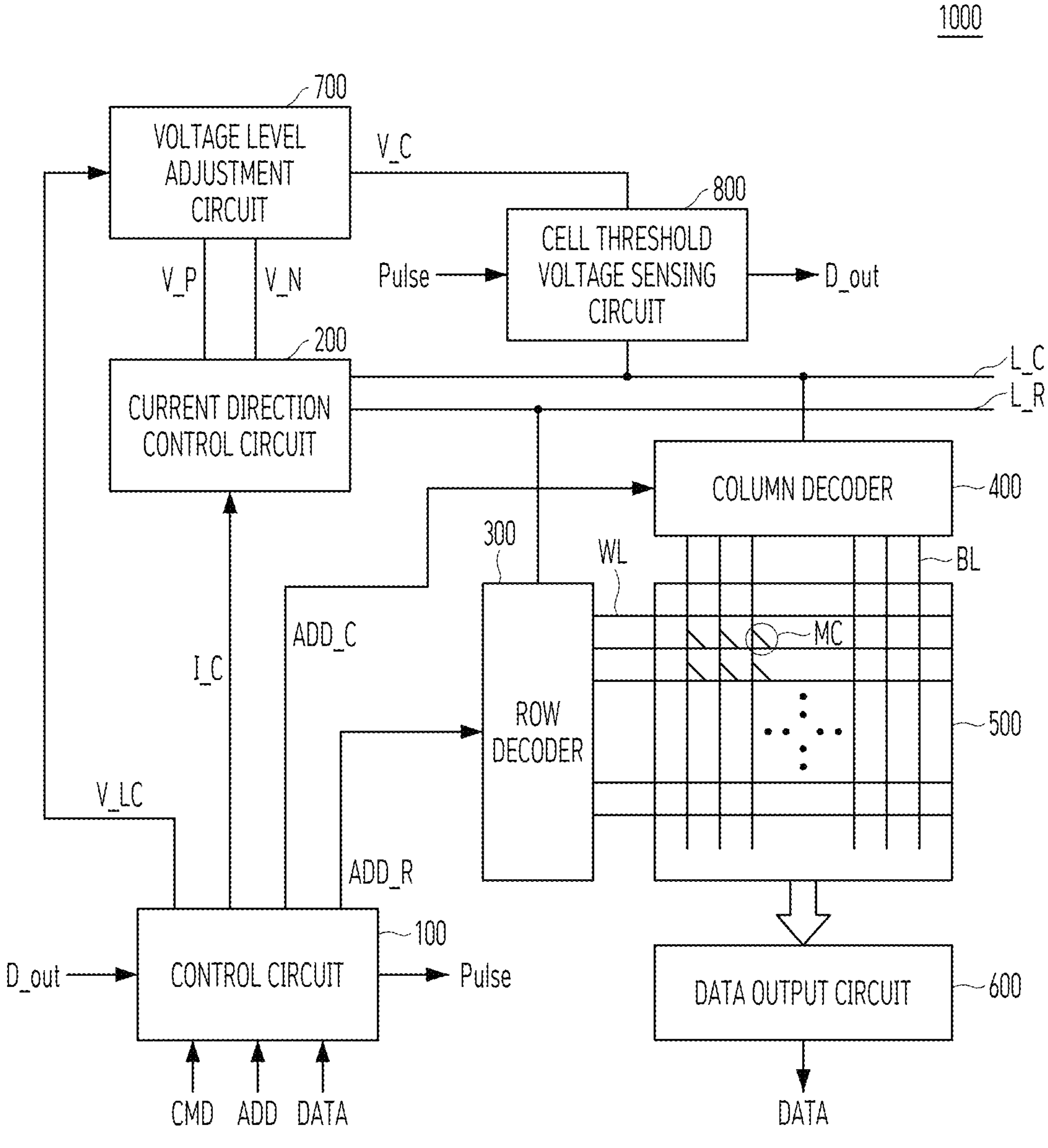
FIG. 1 illustrates a construction of a semiconductor device according to an embodiment of the present disclosure.

FIG. 1 illustrates a semiconductor device 1000 according to an embodiment of the present disclosure.

The semiconductor device 1000 may include a control circuit 100, a current direction control circuit 200, a row decoder 300, a column decoder 400, a memory cell array 500, a data output circuit 600, a voltage level adjustment circuit 700, and a cell threshold voltage sensing circuit 800.

The control circuit 100 may store data in the memory cell array 500 or may output data that have been stored in the memory cell array 500 to the outside of the semiconductor device 1000 through the data output circuit 600 by controlling the current direction control circuit 200, the row decoder 300, and the column decoder 400 based on a command signal CMD, an address signal ADD, and a data signal DATA. In this case, an operation of storing data in the memory cell array 500 may be said to be a write operation, and an operation of outputting data that have been stored in the memory cell array 500 to the outside of the semiconductor device 1000 may be said to be a read operation.

For example, the control circuit 100 that performs a write operation or a read operation may generate a current direction control signal I_C, a row address signal ADD_R, and a column address signal ADD_C, based on the command signal CMD, the address signal ADD, and the data signal DATA.

More specifically, for example, the control circuit 100 may generate the current direction control signal I_C based on the command signal CMD, the data signal DATA, and the address signal ADD, and may provide the current direction control signal I_C to the current direction control circuit 200. At this time, the control circuit 100 may identify whether the command signal CMD is a write command or a read command. Furthermore, the control circuit 100 may provide the row address signal ADD_R to the row decoder 300 by dividing the address signal ADD into the row address signal ADD_R and the column address signal ADD_C, and may provide the column address signal ADD_C to the column decoder 400.

Furthermore, the control circuit 100 according to an embodiment of the present disclosure may adjust the voltage levels of a plurality of voltages V_P, V_N, and V_C based on a threshold voltage sensing result signal D_out. In this case, the plurality of voltages V_P, V_N, and V_C may include first, second, and third voltages V_P, V_N, and V_C. The first voltage V_P may have a higher voltage level than the second voltage V_N. The first voltage V_P may have a positive voltage level. The second voltage V_N may have a negative voltage level. The third voltage V_C may have a voltage level between the voltage levels of the first voltage V_P and the second voltage V_N. For example, the control circuit 100 may generate a voltage level control signal V_LC for adjusting the voltage level of at least one of the first to third voltages V_P, V_N, and V_C based on the threshold voltage sensing result signal D_out, and may provide the voltage level control signal V_LC to the voltage level adjustment circuit 700.

The control circuit 100 may provide a pulse Pulse to the cell threshold voltage sensing circuit 800 based on the command signal CMD, and may be provided with the threshold voltage sensing result signal D_out from the cell threshold voltage sensing circuit 800.

The current direction control circuit 200 may be provided with the first and second voltages V_P and V_N from the voltage level adjustment circuit 700. The current direction control circuit 200 may selectively provide each of the first voltage V_P and the second voltage V_N to either a row voltage line L_R or a column voltage line L_C based on the current direction control signal I_C.

For example, when the first voltage V_P is provided to the row voltage line L_R based on the current direction control signal I_C, the current direction control circuit 200 may provide the second voltage V_N to the column voltage line L_C. Furthermore, when the first voltage V_P is provided to the column voltage line L_C based on the current direction control signal I_C, the current direction control circuit 200 may provide the second voltage V_N to the row voltage line L_R.

The row decoder 300 may select at least one of a plurality of word lines WL based on the row address signal ADD_R, and may drive the selected word line WL to the voltage level of the voltage of the row voltage line L_R. For example, the row decoder 300 may include a plurality of switches that are turned on or off based on the row address signal ADD_R. At least one switch that has been turned on, among the plurality of switches, may drive the selected word line WL to the voltage level of the voltage of the row voltage line L_R by electrically connecting the row voltage line L_R and the selected word line WL.

The column decoder 400 may select at least one of a plurality of bit lines BL based on the column address signal ADD_C, and may drive the selected bit line BL to the voltage level of the voltage of the column voltage line L_C. For example, the column decoder 400 may include a plurality of switches that are turned on or off based on the column address signal ADD_C. At least one switch that has been turned on, among the plurality of switches, may drive the selected bit line BL to the voltage level of the voltage of the column voltage line L_C by electrically connecting the column voltage line L_C and the selected bit line BL.

The memory cell array 500 may include a plurality of memory cells MC, and may be a region in which the plurality of word lines WL and the plurality of bit lines BL intersect with each other. In this case, each memory cell MC is disposed at a location at which one word line WL and one bit line BL intersect with each other. Each memory cell MC may be electrically connected between the word line WL and the bit line BL. Furthermore, each memory cell MC may store data having a set or reset state depending on the polarity of a voltage that is provided by each of the word line WL and the bit line BL. That is, the memory cell MC may store set or reset data depending on the direction of a current that flows into the memory cell MC. For example, if a current that passes through the memory cell MC flows from the word line WL to the bit line BL, the memory cell MC may store the reset data. If a current that passes through the memory cell MC flows from the bit line BL to the word line WL, the memory cell MC may store the set data. Furthermore, a read operation of sensing data that have been stored in the memory cell MC may be performed by providing the memory cell MC with a current having the same direction as the direction when the set data are stored. In this case, the voltage level of voltages that are respectively provided to each of the bit line BL and the word line WL may be adjusted so that a difference between the voltage levels of the bit line BL and the word line WL after the start of a read operation is smaller than a difference between the voltage levels of the bit line BL and the word line WL when the set data are stored. The memory cell MC may be self-selecting memory that includes a chalcogenide alloy.

The data output circuit 600 may sense data that have been stored in the memory cell MC through the word line WL or the bit line BL, and may output the sensed data.

The voltage level adjustment circuit 700 may adjust the voltage level of at least one of the first to third voltages V_P, V_N, and V_C based on the voltage level control signal V_LC. For example, the voltage level adjustment circuit 700 may adjust the voltage level of at least one of the first and second voltages V_P and V_N based on the voltage level control signal V_LC so that a difference between the voltage levels of the first voltage V_P and the second voltage V_N after the start of a read operation is smaller than a difference between the voltage levels of the first voltage V_P and the second voltage V_N after the start of a write operation. Furthermore, the voltage level adjustment circuit 700 may adjust the voltage level of at least one of the first and second voltages V_P and V_N based on the voltage level control signal V_LC so that a difference between the voltage levels of the first voltage V_P and the second voltage V_N after the start of a write operation is greater than a difference between the voltage levels of the first voltage V_P and the second voltage V_N after the start of a read operation. Furthermore, the voltage level adjustment circuit 700 may block the supply of the first voltage V_P, among the first and second voltages V_P and V_N, to the current direction control circuit 200 and adjust the voltage level of the third voltage V_C, based on the voltage level control signal V_LC, after the start of an operation of sensing the threshold voltage of a memory cell. In this case, the third voltage V_C may be provided to the cell threshold voltage sensing circuit 800. If an operation is not an operation of sensing the threshold voltage of a memory cell, the voltage level adjustment circuit 700 may provide the current direction control circuit 200 with the first and second voltages V_P and V_N and block the supply of the third voltage V_C to the cell threshold voltage sensing circuit 800, based on the voltage level control signal V_LC.

After the start of an operation of sensing the threshold voltage of a memory cell, the cell threshold voltage sensing circuit 800 may generate the threshold voltage sensing result signal D_out by being provided with the third voltage V_C and the pulse Pulse. For example, the cell threshold voltage sensing circuit 800 may be provided with the pulse Pulse from the control circuit 100, and may be provided with the third voltage V_C from the voltage level adjustment circuit 700. Furthermore, the cell threshold voltage sensing circuit 800 may provide the threshold voltage sensing result signal D_out to the control circuit 100.

The cell threshold voltage sensing circuit 800 may be described more specifically as follows.

The cell threshold voltage sensing circuit 800 may provide the third voltage V_C to the column voltage line L_C at each specific interval of the pulse Pulse, that is, whenever the pulse is activated. Furthermore, the cell threshold voltage sensing circuit 800 may generate the threshold voltage sensing result signal D_out based on the amount of current that flows into the memory cell MC, whenever the third voltage V_C is provided to the column voltage line L_C. More specifically, when the third voltage V_C is provided to the column voltage line L_C and then provided by the column decoder 400 to a selected bit line BL, the cell threshold voltage sensing circuit 800 may mirror a current that flows from the bit line BL to the word line WL. At this time, the cell threshold voltage sensing circuit 800 may compare the voltage level of a voltage corresponding to the mirrored current and the voltage level of a reference voltage, and may provide the results of the comparison to the control circuit 100 as the threshold voltage sensing result signal D_out.

Figure 2:
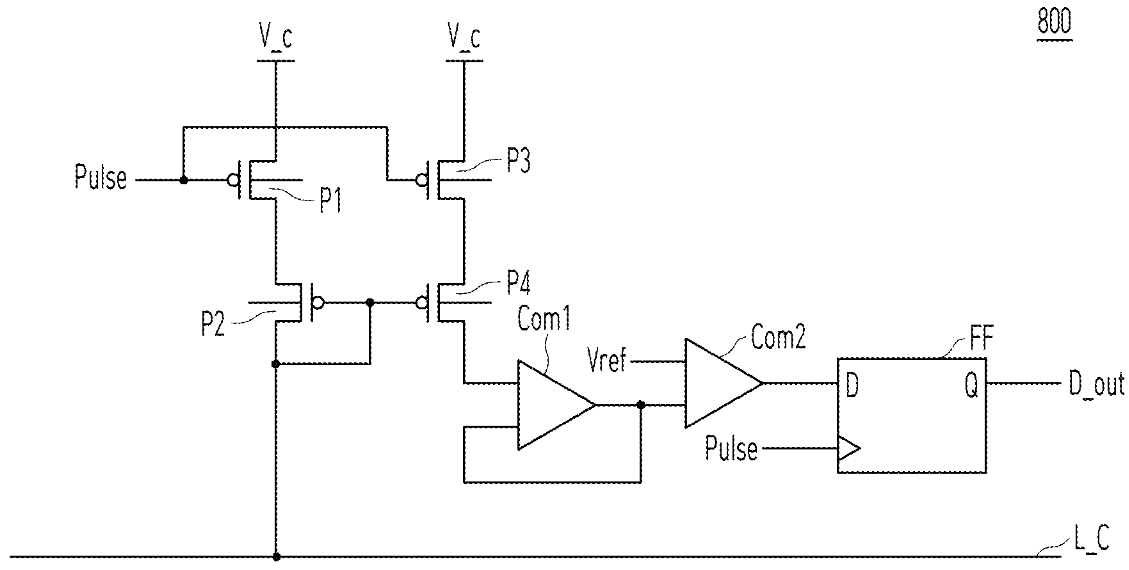
FIG. 2 illustrates a construction of a cell threshold voltage sensing circuit of the semiconductor device according to an embodiment of the present disclosure.

FIG. 2 illustrates construction of the cell threshold voltage sensing circuit 800 of the semiconductor device according to an embodiment of the present disclosure.

Referring to FIG. 2, the cell threshold voltage sensing circuit 800 may include first to fourth transistors P1, P2, P3, and P4, first and second comparison circuits Com1 and Com2, and a flip-flop FF. The first transistor P1 may have a gate provided with the pulse Pulse and may have a source provided with the third voltage V_C. The second transistor P2 may have a gate and a drain connected in common. The column voltage line L_C may be connected to a node to which the gate and drain of the second transistor P2 are connected in common. A drain of the first transistor P1 may be connected to a source of the second transistor P2. The third transistor P3 may have a gate provided with the pulse Pulse and may have a source provided with the third voltage V_C. The gate of the second transistor P2 may be connected to a gate of the fourth transistor P4. A drain of the third transistor P3 may be connected to a source of the fourth transistor P4. A first input of the first comparison circuit Com1 may be connected to a drain of the fourth transistor P4. The first comparison circuit Com1 may have a first input connected to the drain of the fourth transistor P4, and may have a second input and an output connected in common. The second comparison circuit Com2 may have a first input provided with a reference voltage Vref, and may have a second input connected to an output of the first comparison circuit Com1. The flip-flop FF may output the threshold voltage sensing result signal D_out by receiving the pulse Pulse and the output signal of the second comparison circuit Com2. The flip-flop FF may store the output signal of the second comparison circuit Com2 at a specific edge of the pulse Pulse, and may output the stored output signal of the second comparison circuit Com2 as the threshold voltage sensing result signal D_out. In the embodiment of FIG. 2, the first to fourth transistors P1, P2, P3, and P4 are p-channel Metal-Oxide-Semiconductor Field Effect Transistors (MOSFETs) but embodiments are not limited thereto.

An operation of the cell threshold voltage sensing circuit 800 constructed as described above may be described as follows.

The first transistor P1 and the third transistor P3 each having the gate provided with the pulse Pulse may be turned on at a specific interval (e.g., a low interval) of the pulse Pulse. Accordingly, the first transistor P1 may provide the third voltage V_C to the second transistor P2 whenever the pulse Pulse has a low interval, and the third transistor P3 may provide the third voltage V_C to the fourth transistor P4 whenever the pulse Pulse has a low interval.

The second transistor P2 and the fourth transistor P4 may have the gates connected in common, and may have sources provided with voltages having the same voltage level, which are transmitted by the first and third transistors P1 and P3 that have been turned on, respectively. Accordingly, the amounts of currents that flow through the second transistor P2 and the fourth transistor P4, respectively, may be the same because the second and fourth transistors P2 and P4 have gates provided with voltages having the same voltage level, respectively, and have the sources provided with voltages having the same voltage level, respectively. In this case, the second transistor P2 and the fourth transistor P4 may be said to be connected in the form of a current mirror structure.

Furthermore, the gate and drain of the second transistor P2 and the column voltage line L_C may be connected in common. Accordingly, the second transistor P2 may sense the amount of current that is provided to the second column line L_C based on the voltage level of the second column voltage line L_C. Furthermore, the fourth transistor P4 may provide the first input of the first comparison circuit Com1 with the same amount of current as that of the second transistor P2.

The first comparison circuit Com1 may have the second input and the output connected in common, and may operate so that the voltage that is formed at the output has a voltage level corresponding to the current provided by the fourth transistor P4 to the first input (that is, a transimpedance amplifier).

The second comparison circuit Com2 may have the first input provided with the reference voltage Vref, and may have the second input connected to the output of the first comparison circuit Com1. Accordingly, the second comparison circuit Com2 may compare the voltage level of a voltage that is formed at the output of the first comparison circuit Com1 with the voltage level of the reference voltage Vref, and may provide the results of the comparison to the flip-flop FF as an output signal.

The flip-flop FF may store the output signal of the second comparison circuit Com2 at a specific edge (e.g., a rising edge) of the pulse Pulse, and may output the stored output signal as the threshold voltage sensing result signal D_out.

Accordingly, the cell threshold voltage sensing circuit 800 of FIG. 2 may compare the voltage level of a voltage corresponding to the amount of current that is provided to the column voltage line L_C with the voltage level of the reference voltage Vref whenever the pulse Pulse has a low interval, and may output the results of the comparison as the threshold voltage sensing signal D_out.

Figure 3:
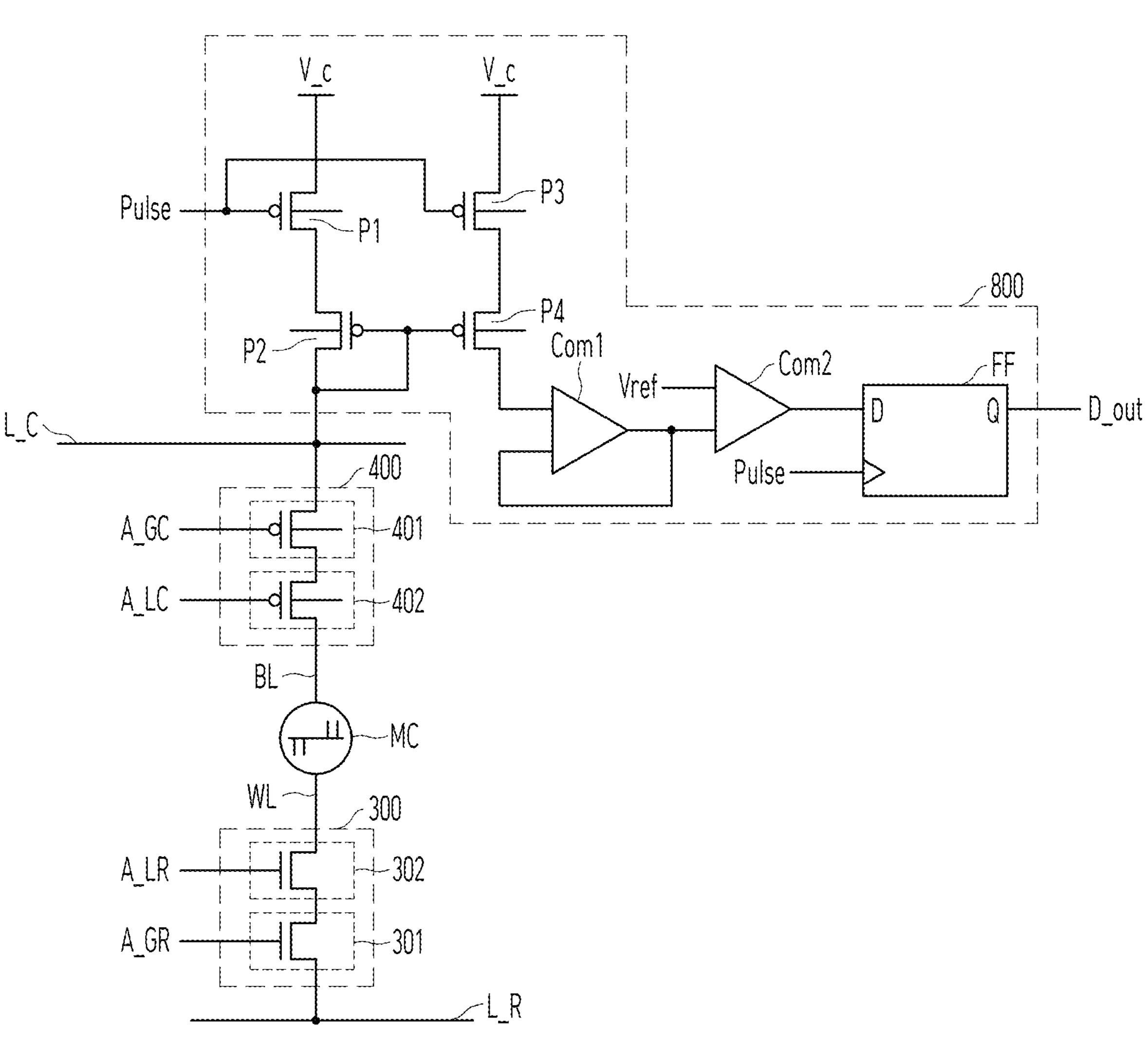
FIG. 3 illustrates a semiconductor device according to an embodiment of the present disclosure.

FIG. 3 is a diagram for simply describing a portion of the semiconductor device 1000 of FIG. 1 according to an embodiment of the present disclosure.

FIG. 3 may illustrate the word line WL that is selected by the row decoder 300, the bit line BL that is selected by the column decoder 400, and the memory cell MC that is connected between the selected bit line BL and the selected word line WL in FIG. 1.

Referring to FIG. 3, the memory cell MC may be electrically connected between the word line WL that is selected by the row decoder 300 and the bit line BL that is selected by the column decoder 400.

The column decoder 400 may select at least one bit line BL, among the plurality of bit lines BL, based on the column address signal ADD_C, and may drive the selected bit line BL to the voltage level of a voltage of the column voltage line L_C. In this case, the column decoder 400 may include, among other devices, a plurality of switches 401 and 402. The plurality of switches 401 and 402 may include at least one global column switch 401 and at least one local column switch 402. The global column switch 401 and the local column switch 402 illustrated in FIG. 3 may be switches that have been turned on by the column address signal ADD_C, among the plurality of switches that are included in the column decoder 400, in order to select one bit line BL.

The global column switch 401 may be connected to the column voltage line L_C and the local column switch 402, and may be turned on by a global column address A_GC.

The local column switch 402 may be connected to the bit line BL and the global column switch 401, and may be turned on by a local column address A_LC. In this case, the column address signal ADD_C may include at least one global column address A_GC and at least one local column address A_LC. In this case, the global column switch 401 and the local column switch 402 may each be implemented as a transistor.

The global column switch 401 and the local column switch 402 that have been turned on may transmit the voltage of the column voltage line L_C to the bit line BL. Accordingly, the column decoder 400 may drive the selected bit line BL to the voltage level of the voltage of the column voltage line L_C, based on the column address signal ADD_C.

The row decoder 300 may select at least one word line WL, among the plurality of word lines WL, based on the row address signal ADD_R, and may drive the selected word line WL to the voltage level of the voltage of the row voltage line L_R. In this case, the row decoder 300 may include, among other devices, a plurality of switches 301 and 302. The plurality of switches 301 and 302 may include at least one global row switch 301 and at least one local row switch 302. The global row switch 301 and the local row switch 302 illustrated in FIG. 3 may be switches that have been turned on by the row address signal ADD_R, among the plurality of switches that are included in the row decoder 300, in order to select one word line WL.

The global row switch 301 may be connected to the row voltage line L_R and the local row switch 302, and may be turned on by a global row address A_GR.

The local row switch 302 may be connected to the word line WL and the global row switch 301, and may be turned on by a local row address A_LR. In this case, the row address signal ADD_R may include at least one global row address A_GR and at least one local row address A_LR. In this case, the global row switch 301 and the local row switch 302 may each be implemented as a transistor.

The global row switch 301 and the local row switch 302 that have been turned on may transmit the voltage of the row voltage line L_R to the word line BWL. Accordingly, the row decoder 300. may drive the selected word line WL to the voltage level of the voltage of the row voltage line L_R based on the row address signal ADD_R.

As described above, the semiconductor device according to an embodiment of the present disclosure may perform a write operation of transiting the state of the memory cell MC that is connected between a selected bit line BL and a selected word line WL to the set state or the reset state. Furthermore, the semiconductor device may perform a read operation of checking whether the state of the memory cell MC that is connected between a selected bit line BL and a selected word line WL is the set state or the reset state and outputting the checked state of the memory cell MC.

Furthermore, the semiconductor device according to an embodiment of the present disclosure may perform an operation of sensing the threshold voltage of the memory cell MC that is connected between a selected bit line BL and a selected word line WL.

An operation of sensing, by the semiconductor device according to an embodiment of the present disclosure, the threshold voltage of a memory cell may be described as follows.

The cell threshold voltage sensing circuit 800 may transmit the third voltage V_C to the column voltage line L_C at each specific interval of the pulse Pulse, that is, whenever the pulse is activated. At this time, the second voltage V_N may be applied to the row voltage line L_R. The third voltage V_C may be a voltage having a higher voltage level than the second voltage V_N.

The third voltage V_C that is transmitted to the column voltage line L_C may be transmitted to the selected bit line BL through the global column switch 401 and the local column switch 402 that are turned on at each specific interval of the pulse Pulse.

Furthermore, the second voltage V_N that is transmitted to the row voltage line L_R may be transmitted to a selected word line WL through the global row switch 301 and the local row switch 302 that have been turned on.

Accordingly, a current may flow through a selected bit line BL, the memory cell MC, and a selected word line WL at each specific interval of the pulse Pulse, that is, whenever the pulse is activated. That is, a current having an amount corresponding to the voltage level of the threshold voltage of the memory cell MC may flow into the memory cell MC at each specific interval of the pulse Pulse. At this time, a random read voltage may be provided to the memory cell MC through the selected bit line and the selected word line.

The cell threshold voltage sensing circuit 800 may generate a current having the same amount as a current that flows into the memory cell MC at each specific interval of the pulse Pulse, and may compare a voltage corresponding to the amount of the generated current with the reference voltage Vref. Furthermore, the cell threshold voltage sensing circuit 800 may store and output the results of the comparison at a specific edge of the pulse Pulse.

Figure 4:
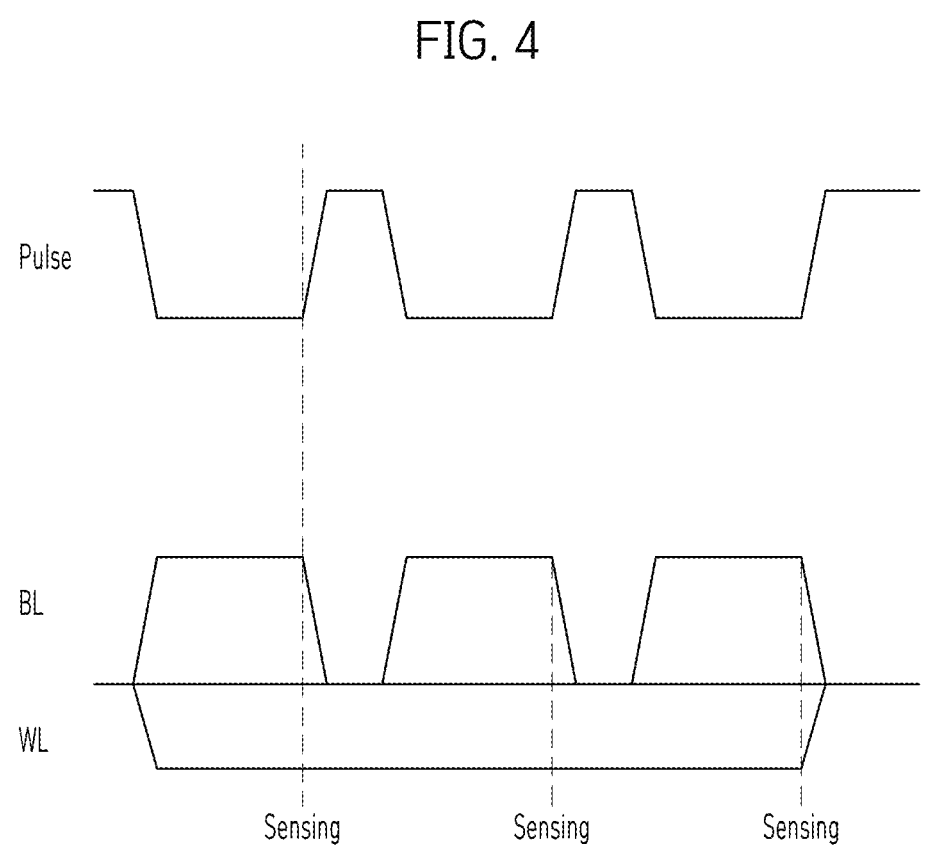

An operation of the cell threshold voltage sensing circuit 800 may be described more specifically as follows with reference to FIGS. 3 and 4.

In a low interval of the pulse Pulse, the first and second transistors P1 and P2 may provide a current that flows into a current path that is formed by the column voltage line L_C, the global column switch 401 that has been turned on, the local column switch 402 that has been turned on, the bit line BL, the memory cell MC, the word line WL, the local row switch 302 that has been turned on, the global row switch 301 that has been turned on, and the row voltage line L_R. Accordingly, the amount of current that flows through the memory cell MC may be the same as the amount of current that flows through the first and second transistors P1 and P2.

The third and fourth transistors P3 and P4 that are included in the cell threshold voltage sensing circuit 800 may make flow the same amount of current as a current that flows through the first and second transistors P1 and P2 that provide the column voltage line L_C with the third voltage V_C, at a specific interval (e.g., a low interval) of the pulse Pulse. In particular, the reason for this is that the fourth transistor P4 and the second transistor P2 have been connected in the form of a current mirror in which the gate of the fourth transistor P4 and the gate of the second transistor P2 have been connected in common and a voltage that is provided to the source of the fourth transistor P4 is the same as that of the second transistor P2.

Accordingly, the third and fourth transistors P3 and P4 may make flow the same amount of current as a current that flows through the memory cell MC. In some embodiments, the second and fourth transistors P2 and P4 may be configured as is known in the related arts so that the current that flows through the third and fourth transistors P3 and P4 is a multiple of the current that flows through the memory cell MC.

The first comparison circuit Com1 may provide the second comparison circuit Com2 with a voltage corresponding to a current that is provided by the third and fourth transistors P3 and P4.

The second comparison circuit Com2 may compare the voltage level of the voltage that is provided by the first comparison circuit Com1 with the voltage level of the reference voltage Vref, and may provide the results of the comparison to the flip-flop FF. For example, when the voltage level of a voltage that is provided by the first comparison circuit Com1, that is, an input voltage, is lower than the voltage level of the reference voltage Vref, the second comparison circuit Com2 may output a signal having a low level. When the voltage level of a voltage that is provided by the first comparison circuit Com1, that is, an input voltage, is higher than the voltage level of the reference voltage Vref, the second comparison circuit Com2 may output a signal having a high level.

The flip-flop FF may store the output signal of the second comparison circuit Com2 at a specific edge (e.g., a rising edge) of the pulse Pulse, and may output the stored output signal as the threshold voltage sensing result signal D_out.

The output of the cell threshold voltage sensing circuit 800, that is, the threshold voltage sensing result signal D_out, may be provided to the control circuit 100.

The control circuit 100 may generate the voltage level control signal V_LC to control the voltage level of the third voltage V_C based on the threshold voltage sensing result signal D_out.

An operation of the control circuit 100 generating the voltage level control signal V_LC based on the threshold voltage sensing result signal D_out may be described as follows with reference to FIGS. 5 and 6.

As described above, the memory cell MC that is connected between a selected bit line BL and a selected word line BL may be turned on when a difference between the voltage levels of the third voltage V_C and the second voltage V_N is greater than the threshold voltage of the memory cell MC at each low interval of the pulse Pulse. The memory cell MC may be turned off when a difference between the voltage levels of the third voltage V_C and the second voltage V_N is smaller than the threshold voltage of the memory cell MC. At this time, the voltage level of a voltage that corresponds to the amount of current that passes through the memory cell MC when the memory cell MC is turned on may be the voltage level of the reference voltage Vref (FIGS. 2 and 3).

Accordingly, the semiconductor device according to an embodiment of the present disclosure may output information on whether the memory cell MC has been turned on as the threshold voltage sensing result signal D_out by comparing a voltage corresponding to the amount of current that flows through the memory cell MC with the reference voltage Vref.

Therefore, the semiconductor device according to an embodiment of the present disclosure may be configured to adjust only the voltage level of the third voltage V_C, among the second and third voltages V_N and V_C, based on the threshold voltage sensing result signal D_out. Accordingly, whether the memory cell MC has been turned on may be determined by the voltage level of the third voltage V_C.

Figure 5:
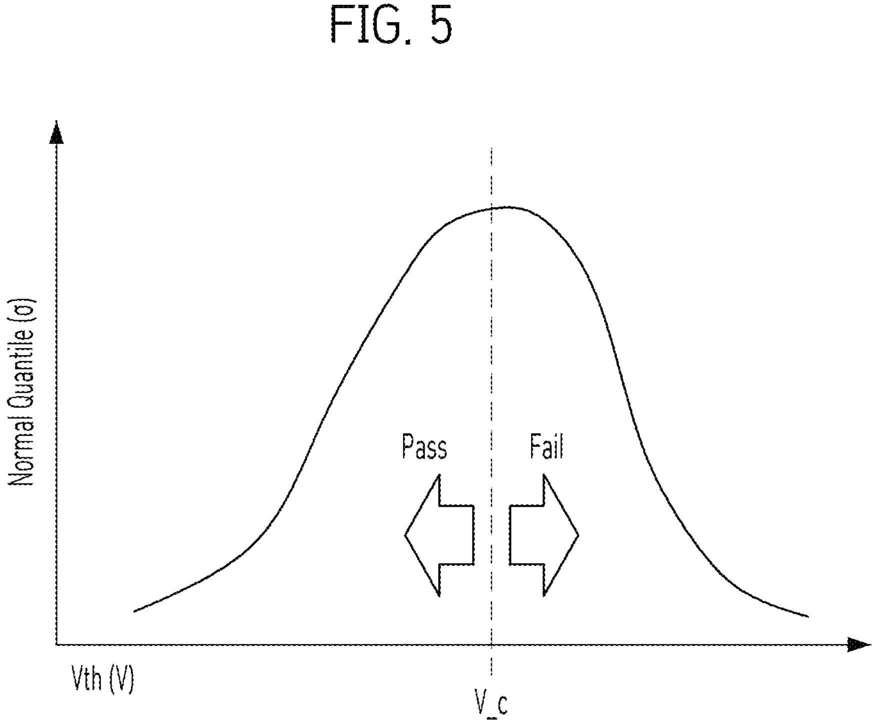

In FIG. 5, a pass (Pass) may mean the turn-off of the memory cell MC, and a fail (Fail) may mean the turn-on of the memory cell MC. In a semiconductor device according to an embodiment, while applying a series of pulses to a memory cell MC as described above, the third voltage V_C may be decreased in response to each fail and may be increased in response each pass. In another embodiment, the third voltage V_C may be decreased in response to consecutive fails, may be increased in response to consecutive passes, and may be left unchanged in response to a pass being followed by a fail or to a fail being followed by a pass. In either of such embodiments, as described below, when a series of pulses at a given value or pair of adjacent values of the third voltage V_C produces alternating pass and fail results, then the difference between the given value or pair of adjacent values of the third voltage V_C and the second voltage V_N may correspond to the threshold voltage of the memory cell MC.

As illustrated in FIG. 5, the turn-on and turn-off of the memory cell MC may be determined, that is, a pass and a fail may be determined, based on the voltage level of the third voltage V_C. The results of the determination may be provided to the control circuit 100 through the threshold voltage sensing result signal D_out. In this case, when the threshold voltage sensing result signal D_out has a low level, this may mean a pass. When the threshold voltage sensing result signal D_out has a high level, this may mean a fail.

Accordingly, in the semiconductor device according to an embodiment of the present disclosure, information on whether the memory cell MC that is connected between a selected bit line BL and a selected word line WL has been turned on may be provided to the control circuit 100 through the threshold voltage sensing result signal D_out whenever a specific interval (e.g., a low interval) of the pulse Pulse is repeated.

Figure 6:
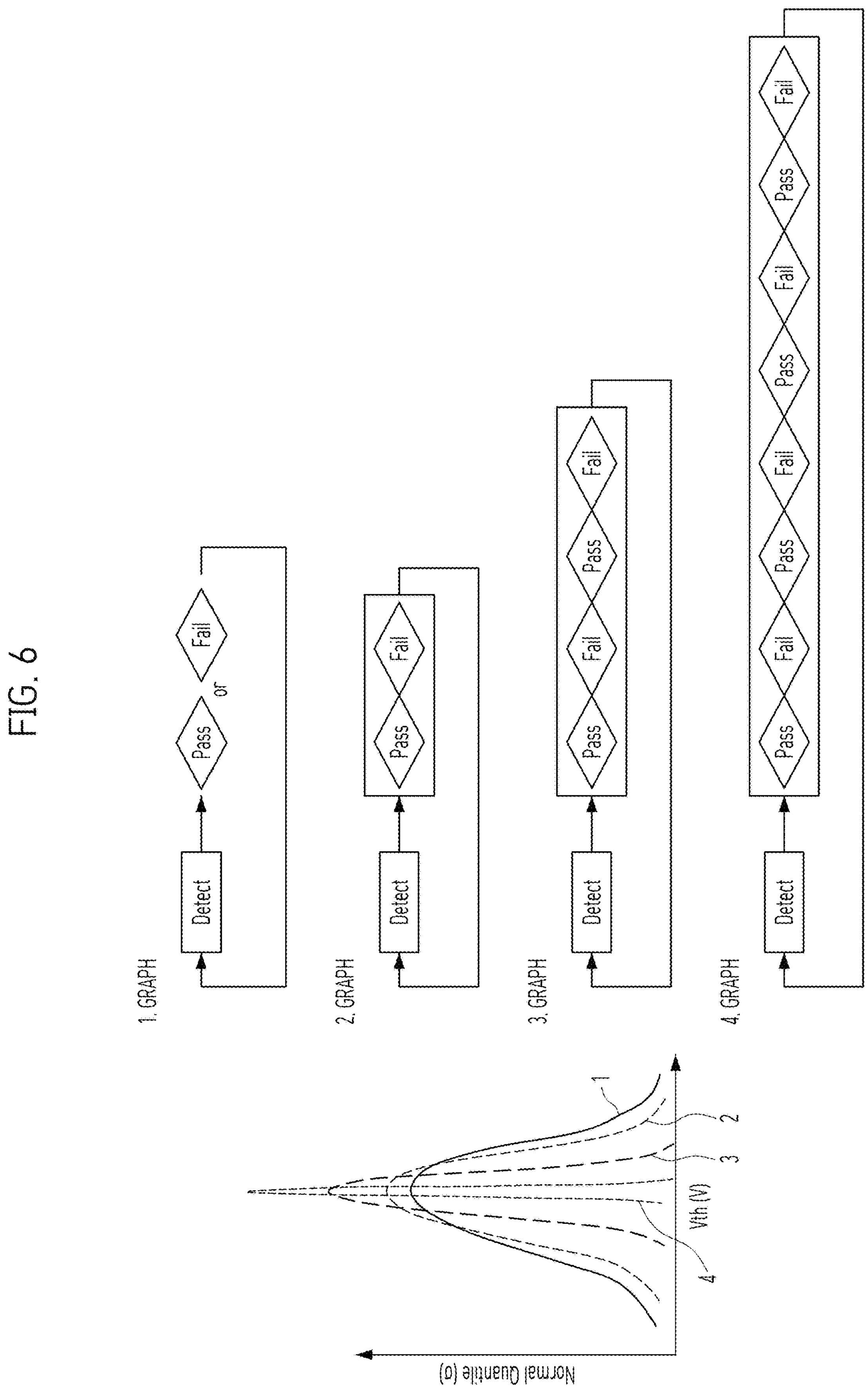

Referring to FIG. 6, a graph 1 in FIG. 6 may illustrate a distribution of the threshold voltages of the memory cell MC when the threshold voltage sensing result signal D_out that is generated by the pulse Pulse including one low interval is generated to have a level that means one of a pass and a fail.

A graph 2 in FIG. 6 may illustrate a distribution of the threshold voltages of the memory cell MC when the threshold voltage sensing result signal D_out that is generated by the pulse Pulse including two low intervals is generated to have a level that continuously means a pass and a fail.

A graph 3 in FIG. 6 may illustrate a distribution of the threshold voltages of the memory cell MC when the threshold voltage sensing result signal D_out that is generated by the pulse Pulse including four low intervals is formed to have a level that continuously means a pass, a fail, a pass, and a fail.

A graph 4 in FIG. 6 may illustrate a distribution of the threshold voltages of the memory cell MC when the threshold voltage sensing result signal D_out that is generated by the pulse Pulse including eight low intervals is generated to have a level that continuously means a pass, a fail, a pass, a fail, a pass, a fail, a pass, and a fail.

A graph in which the level change width of the threshold voltage Vth is the smallest and that is the closest to the center of a distribution of the threshold voltages, among the graphs 1 to 4 of FIG. 6, may be the graph 4.

Accordingly, the control circuit 100 of the semiconductor device according to an embodiment of the present disclosure may be configured to determine that the third voltage V_C is a voltage corresponding to the threshold voltage of the memory cell MC, when the threshold voltage sensing result signal D_out is repeatedly formed at a level that means a pass and a fail at each low interval of the pulse Pulse with respect to the third voltage V_C having the same level; that is, when a level of the third voltage V_C is approximately equally likely to produce a pass result or a fail result.

Furthermore, the control circuit 100 of the semiconductor device according to another embodiment of the present disclosure may be configured to determine that the third voltage V_C is a voltage corresponding to the threshold voltage of the memory cell MC, when the ratio of the number of passes of the threshold voltage sensing result signal D_out and the number of fails of the threshold voltage sensing result signal D_out, which are formed at each low interval of the pulse Pulse with respect to the third voltage V_C having the same level, is within a predetermined range.

The semiconductor device according to an embodiment of the present disclosure may change the voltage level of the third voltage V_C based on the threshold voltage sensing result signal D_out, and may search for the voltage level of the third voltage V_C that enables the threshold voltage sensing result signal D_out to continuously repeat a pass and a fail. In this case, the voltage level of the third voltage V_C that enables the threshold voltage sensing result signal D_out to continuously repeat a pass and a fail may correspond to the voltage level of the threshold voltage of the memory cell MC, and may be the center level of the threshold voltages of the memory cells MC in a distribution of the threshold voltages of the memory cells MC. An interval in which such an operation is performed may be said to be a random-read voltage tuning interval.

Furthermore, the semiconductor device according to an embodiment of the present disclosure may change the voltage level of the third voltage V_C based on the threshold voltage sensing result signal D_out, and may determine that the voltage level of the third voltage V_C corresponds to the threshold voltage of the memory cell MC when the number of each of passes and fails of the threshold voltage sensing result signal D_out and/or a ratio thereof is within a predetermined range.

When the semiconductor device according to an embodiment of the present disclosure senses the third voltage V_C corresponding to the threshold voltage of a selected memory cell MC, the semiconductor device may generate the threshold voltage sensing result signal D_out at each specific interval of the pulse Pulse by providing the sensed third voltage V_C and the pulse Pulse to the cell threshold voltage sensing circuit 800. In this case, as the voltage level of the third voltage V_C becomes closer to corresponding to the voltage level of the threshold voltage of the memory cell MC, that is, the center of the distribution of the threshold voltages, the level of the threshold voltage sensing result signal D_out may be randomly generated. Accordingly, the semiconductor device according to an embodiment of the present disclosure may generate a random number. In this case, an interval in which the random number is generated may be said to be a random data generation interval, and the voltage value of the of the third voltage V_C used in the random data generation interval may be referred to as a random-read voltage.

Figure 7:
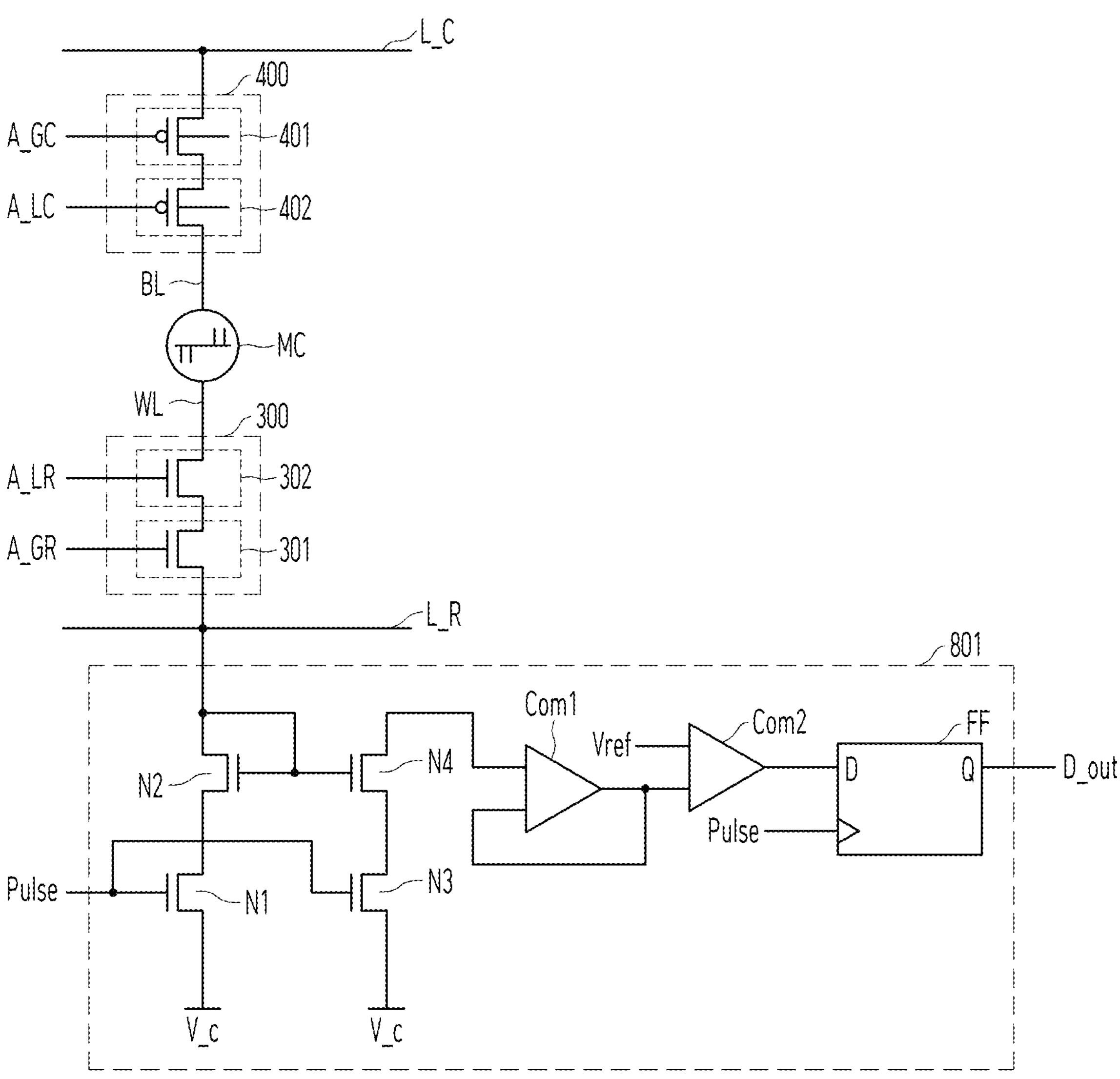
FIG. 7 illustrates a semiconductor device according to another embodiment of the present disclosure.

FIG. 7 illustrates a semiconductor device according to another embodiment of the present disclosure.

FIG. 7 may be a diagram for describing the semiconductor device in which a cell threshold voltage sensing circuit 801 is connected to the row voltage line L_R.

FIG. 7 may illustrate the word line WL that is selected by the row decoder 300, the bit line BL that is selected by the column decoder 400, and the memory cell MC that is connected between the selected bit line BL and the selected word line WL in FIG. 1.

Referring to FIG. 7, the memory cell MC may be electrically connected between the word line WL that is selected by the row decoder 300 and the bit line BL that is selected by the column decoder 400.

The column decoder 400 may select at least one bit line BL, among the plurality of bit lines BL, based on the column address signal ADD_C, and may drive the selected bit line BL to the voltage level of the voltage of the column voltage line L_C. In this case, the column decoder 400 may include a plurality of switches 401 and 402. The plurality of switches 401 and 402 may include at least one global column switch 401 and at least one local column switch 402. The global column switch 401 and the local column switch 402 illustrated in FIG. 7 may be switches that have been turned on by the column address signal ADD_C, among the plurality of switches that are included in the column decoder 400, in order to select one bit line BL.

The global column switch 401 may be connected to the column voltage line L_C and the local column switch 402, and may be turned on by a global column address A_GC.

The local column switch 402 may be connected to the bit line BL and the global column switch 401, and may be turned on by the local column address A_LC. In this case, the column address signal ADD_C may include at least one global column address A_GC and at least one local column address A_LC. In this case, the global column switch 401 and the local column switch 402 may each be implemented as a transistor.

The global column switch 401 and the local column switch 402 that have been turned on may transmit the voltage of the column voltage line L_C to the bit line BL. Accordingly, the column decoder 400 may drive the selected bit line BL to the voltage level of the voltage of the column voltage line L_C based on the column address signal ADD_C.

The row decoder 300 may select at least one word line WL, among the plurality of word lines WL, based on the row address signal ADD_R, and may drive the selected word line WL to the voltage level of the voltage of the row voltage line L_R. In this case, the row decoder 300 may include a plurality of switches 301 and 302. The plurality of switches 301 and 302 may include at least one global row switch 301 and at least one local row switch 302. The global row switch 301 and the local row switch 302 illustrated in FIG. 7 may be switches that have been turned on by the row address signal ADD_R, among the plurality of switches that are included in the row decoder 300, in order to select one word line WL.

The global row switch 301 may be connected to the row voltage line L_R and the local row switch 302, and may be turned on by a global row address A_GR.

The local row switch 302 may be connected to the word line WL and the global row switch 301, and may be turned on by a local row address A_LR. In this case, the row address signal ADD_R may include at least one global row address A_GR and at least one local row address A_LR. In this case, the global row switch 301 and the local row switch 302 may each be implemented as a transistor.

The global row switch 301 and the local row switch 302 that have been turned on may transmit the voltage of the row voltage line L_R to the word line BL. Accordingly, the row decoder 400 may drive the selected word line WL to the voltage level of the voltage of the row voltage line L_R based on the row address signal ADD_R.

As described above, the semiconductor device according to another embodiment of the present disclosure may perform a write operation of transiting the state of the memory cell MC that is connected between a selected bit line BL and a selected word line WL to the set state or the reset state. Furthermore, the semiconductor device may perform a read operation of checking whether the state of the memory cell MC that is connected between the selected bit line BL and the selected word line WL is the set state or the reset state and outputting the checked state of the memory cell MC.

Furthermore, the semiconductor device according to another embodiment of the present disclosure may perform an operation of sensing the threshold voltage of the memory cell MC that is connected between a selected bit line BL and a selected word line WL.

A construction of the cell threshold voltage sensing circuit 801 of the semiconductor device according to another embodiment of the present disclosure may be described as follows.

The cell threshold voltage sensing circuit 801 may include first to fourth transistors N1, N2, N3, and N4, a first comparison circuit Com1, a second comparison circuit Com2, and a flip-flop FF. In the embodiment of FIG. 7, the first to fourth transistors N1, N2, N3, and N4 are n-channel MOSFETs, but embodiments are not limited thereto. The first transistor N1 may have the pulse Pulse input to a gate thereof and have the third voltage V_C applied to a source thereof. The second transistor N2 may have a gate and a drain connected in common, and may have a source connected to a drain of the first transistor N1. In this case, a node to which the gate and drain of the second transistor N2 are connected in common may be connected to the row voltage line L_R. The third transistor N3 may have the pulse Pulse input to a gate thereof and have the second voltage V_C applied to a source thereof. The fourth transistor N4 may have a gate connected to the gate of the second transistor N2, and may have a source connected to a drain of the third transistor N3. The first comparison circuit Com1 may have a first input connected to a drain of the fourth transistor N4, and may have a second input and an output connected in common. Accordingly, the same voltage level as a voltage level that is formed at the first input of the first comparison circuit Com1 may be formed at the output of the first comparison circuit Com1. The second comparison circuit Com2 may have a reference voltage Vref input to a first input thereof, and may have a second input connected to the output of the first comparison circuit Com1. The flip-flop FF may receive the pulse Pulse and the output signal of the second comparison circuit Com2, may store the output signal of the second comparison circuit Com2 at a specific edge (e.g., a falling edge) of the pulse Pulse, and may output the stored output signal as the threshold voltage sensing result signal D_out.

Figure 8:
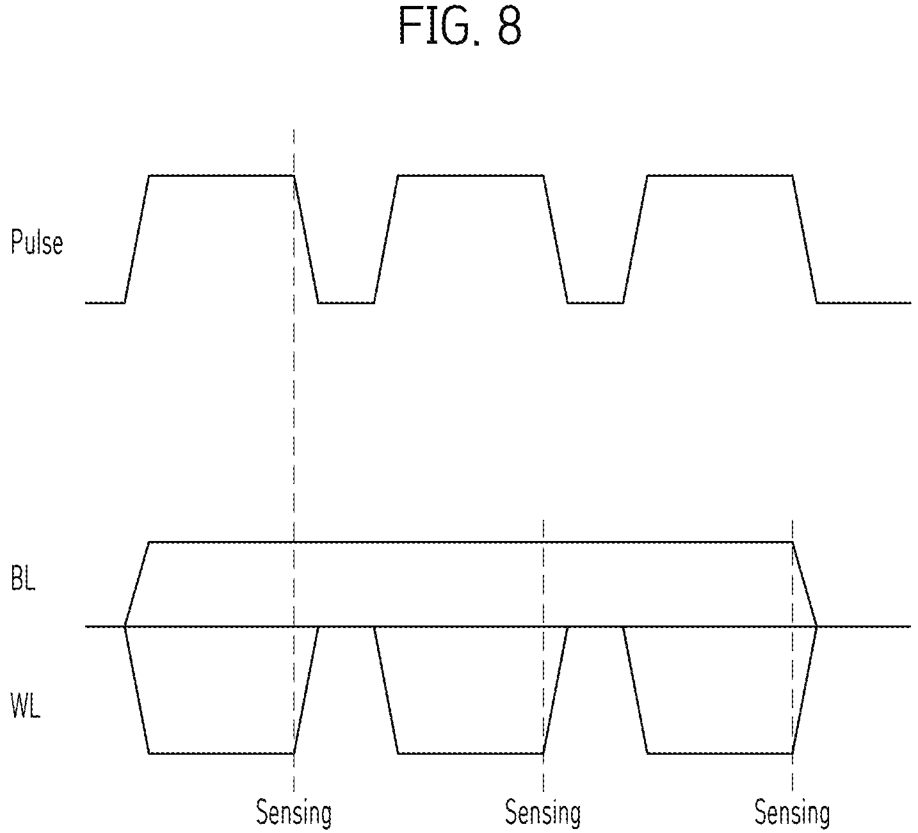
FIG. 8 illustrates an operation of the semiconductor device according to another embodiment of the present disclosure.

An operation of sensing, by the semiconductor device constructed as described above according to another embodiment of the present disclosure, the threshold voltage of a memory cell may be described as follows with reference to FIG. 8.

The cell threshold voltage sensing circuit 801 may transmit the third voltage V_C to the row voltage line L_R at each specific interval (e.g., a high interval) of the pulse Pulse. At this time, the first voltage V_P may be applied to the column voltage line L_C. The third voltage V_C may be a voltage having a lower voltage level than the first voltage V_P.

The third voltage V_C that is transmitted to the row voltage line L_R may be transmitted to a selected word line WL through the global row switch 301 and the local row switch 302 that are turned on at each specific interval of the pulse Pulse.

Furthermore, the first voltage V_P that is transmitted to the column voltage line L_C may be transmitted to a selected bit line WL through the global column switch 401 and the local column switch 402 that are turned on.

Accordingly, a current may flow into the selected bit line BL, the memory cell MC, and the selected word line WL at each specific interval (e.g., a high interval) of the pulse Pulse. That is, a current having an amount corresponding to the voltage level of the threshold voltage of the memory cell MC may flow into the memory cell MC at each specific interval of the pulse Pulse.

The cell threshold voltage sensing circuit 801 may generate a current having the same amount as a current that flows into the memory cell MC at each specific interval of the pulse Pulse, and may compare a voltage corresponding to the amount of the generated current with the reference voltage Vref. Furthermore, the cell threshold voltage sensing circuit 800 may store the results of the comparison at a specific edge (e.g., a falling edge) of the pulse Pulse, and may output the results of the comparison as the threshold voltage sensing result signal D_out.

Each of the semiconductor devices according to another embodiment of the present disclosure, which have been described with reference to FIGS. 7 and 8, has the construction different from that of each of the semiconductor devices according to an embodiment of the present disclosure, which have been described with reference to FIGS. 2 to 6, but may perform the same operation of generating a random number by sensing the threshold voltage of a memory cell as the operation of each of the semiconductor devices according to an embodiment of the present disclosure, which have been described with reference to FIGS. 2 to 6. Accordingly, further description of the constructions and operation of the semiconductor devices according to the embodiment of FIGS. 7 and 8 will be omitted in the interest of brevity.

Although embodiments according to the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:

a memory cell connected between a bit line and a word line; and a cell threshold voltage sensing circuit configured to:

provide a random-read voltage to the memory cell whenever a pulse is activated, generate a voltage corresponding to a current through the memory cell whenever the pulse is activated, and produce a threshold voltage sensing result signal by comparing the generated voltage to a reference voltage, wherein the pulse is activated a plurality of times during an interval in which the word line is activated.

2. The semiconductor device of claim 1, wherein:

when the pulse is activated, a second voltage is applied to the word line, and the cell threshold voltage sensing circuit provides the random-read voltage to the memory cell by applying a first voltage to the bit line.

3. The semiconductor device of claim 2, further comprising a control circuit configured to adjust, based on the threshold voltage sensing result signal in a random read voltage tuning interval, a voltage level of the random-read voltage so that random data are able to be read from the memory cell.

4. The semiconductor device of claim 3, wherein in a random data generation interval, the cell threshold voltage sensing circuit outputs a value of the random data from the memory cell based on the random-read voltage having the voltage level adjusted during the random read voltage tuning interval.

5. The semiconductor device of claim 3, wherein the control circuit during the random read voltage tuning interval adjusts a voltage level of the first voltage until the threshold voltage sensing result signal repeats an identical pattern.

6. The semiconductor device of claim 3, wherein the control circuit during the random read voltage tuning interval adjusts a voltage level of the first voltage until a ratio of a number of first levels of the threshold voltage sensing result signal and a number of second levels of the threshold voltage sensing result signal is within a predetermined range.

7. The semiconductor device of claim 1, further comprising:

a column decoder configured to select the bit line based on an address signal and to drive the selected bit line to a voltage level of a voltage of a column voltage line, and a row decoder configured to select the word line based on the address signal and to drive the selected word line to a voltage level of a voltage of a row voltage line.

8. The semiconductor device of claim 7, wherein the cell threshold voltage sensing circuit provide the first voltage to the column voltage line whenever the pulse is activated.

9. The semiconductor device of claim 8, wherein the cell threshold voltage sensing circuit comprises:

a first transistor having a gate provided with a pulse input and having a source provided with a first voltage;

a second transistor having a gate and a drain connected in common and having a source connected to a drain of the first transistor, wherein the column voltage line is connected to a node to which the gate and drain of the second transistor are connected;

a third transistor and a fourth transistor configured to generate a current having an amount that is proportional to an amount of a current that is provided to the column voltage line by the first and second transistors;

a first comparison circuit configured to output a voltage having a voltage level corresponding to the current that is generated by the third and fourth transistors;

a second comparison circuit configured to compare the voltage that is generated by the first comparison circuit with the reference voltage; and a flip-flop configured to store an output signal of the second comparison circuit at each specific edge of the pulse and to output the stored output signal as the threshold voltage sensing result signal.

10. The semiconductor device of claim 9, wherein:

the third transistor has a gate provided with the pulse input and has a source provided with the first voltage, and the fourth transistor has a gate connected to the gate of the second transistor, a source connected to a drain of the third transistor, and a drain connected to the first comparison circuit.

11. An operating method of a semiconductor device, comprising:

providing a first voltage to one of a bit line and a word line whenever a pulse is activated in a random read voltage tuning interval;

providing a second voltage having a lower voltage level than the first voltage to one of the bit line and the word line;

generating a current having an amount that is identical with an amount of current that flows through a memory cell that is connected between the bit line and the word line;

generating a voltage corresponding to the identical amount of current and comparing a voltage level of the voltage with a voltage level of a reference voltage; and adjusting the voltage level of the first voltage based on a result of the comparison, wherein the pulse is activated a plurality of times during an interval in which the word line is activated.

12. The operating method of claim 11, wherein the adjusting of the voltage level of the first voltage is performed until the result of the comparison repeats an identical pattern.

13. The operating method of claim 11, wherein:

the result of the comparison comprises a signal that is output at one of a first level and a second level, and the adjusting of the voltage level of the first voltage is performed until a number of first levels and a number of second levels output as the result of the comparison are each within a predetermined range.

14. The operating method of claim 11, wherein:

when the adjusting of the voltage level of the first voltage is completed, a random data generation is performed in a random data generation interval, and in the random data generation interval, a random number is generated based on the first voltage the adjustment of the voltage level of which has been completed and the pulse.

15. The operating method of claim 14, wherein the completion of the adjustment of the voltage level of the first voltage comprises that the result of the comparison repeats an identical pattern.

16. The operating method of claim 14, wherein:

the result of the comparison comprises a signal that is output at one of a first level and a second level, and the completion of the adjustment of the voltage level of the first voltage comprises a case in which a ratio of a number of first levels and a number of second levels output as the result of the comparison is within a predetermined range.

* * * * *